United States Patent [19]
Hsue

[11] Patent Number: 5,310,693
[45] Date of Patent: May 10, 1994

[54] METHOD OF MAKING SELF-ALIGNED DOUBLE DENSITY POLYSILICON LINES FOR EPROM

[75] Inventor: Peter C. C. Hsue, Hsin-Chu, Taiwan

[73] Assignee: United Microelectronics Corporation, Hsinchu, Taiwan

[21] Appl. No.: 80,503

[22] Filed: Jun. 24, 1993

Related U.S. Application Data

[62] Division of Ser. No. 838,843, Feb. 21, 1992, Pat. No. 5,236,853.

[51] Int. Cl.$^5$ .................. H01L 21/265; H01L 27/115
[52] U.S. Cl. ........................................ 437/43; 437/52; 437/191; 437/924
[58] Field of Search ............... 437/43, 47, 48, 52, 437/191, 924

[56] References Cited

U.S. PATENT DOCUMENTS

| | | | |
|---|---|---|---|
| 4,502,914 | 3/1985 | Trumpp et al. | 156/643 |
| 4,648,937 | 3/1987 | Ogura et al. | 156/643 |
| 4,839,305 | 6/1989 | Brighton | 437/41 |
| 4,868,136 | 9/1989 | Ravaglia | 437/73 |
| 5,002,896 | 3/1991 | Naruke | 437/48 |
| 5,114,872 | 5/1992 | Roselle et al. | 437/48 |

Primary Examiner—George Fourson
Assistant Examiner—Richard A. Booth
Attorney, Agent, or Firm—George O. Saile

[57] ABSTRACT

A method of forming a closely spaced self-aligned polysilicon pattern of conductive lines is achieved. The method involves forming semiconductor device structures in and on a semiconductor substrate. An insulating layer is formed over the device structures. An insulating layer structure is formed over the semiconductor device structures. A conductive polysilicon layer is formed over the insulating layer. A silicon oxide layer is formed over the polysilicon layer. The oxide layer is now patterned by lithography and etching. The patterning of the oxide layer leaves a first pattern of the oxide over a first designated plurality of polysilicon conductor lines and a second pattern between the oxide which exposes the polysilicon layer over a second designated plurality of polysilicon conductor lines plus the planned spacing between the first and second plurality of polysilicon conductor lines. A uniform thickness silicon nitride layer is deposited over the oxide layer and the exposed polysilicon layer wherein the thickness is the width of the planned spacing. The nitride layer is anisotropically etched to produce sidewall structures having the width of the planned spacing. The exposed polysilicon layer is oxidized to form a silicon oxide layer thereon. The sidewall structures are removed by etching. The exposed polysilicon layer is anisotropically etched to form the closely spaced polysilicon conductor lines. The oxide layers over the polysilicon conductor lines are removed as by etching.

6 Claims, 4 Drawing Sheets

METHOD OF MAKING SELF-ALIGNED DOUBLE DENSITY POLYSILICON LINES FOR EPROM

This application is a divisional application of Ser. No. 07/838,843, filed Feb. 21, 1992, now U.S. Pat. No. 5,236,853.

BACKGROUND OF THE INVENTION (1) Field of the Invention

This invention relates to the fabrication of integrated circuit devices and more particularly to a method of making self-aligned and closely spaced polysilicon lines for read only memory (ROM) and the like.

(2) Description of the Prior Art

Lithography resolution is limited by optical design. The technology of read only memory is therefore limited, because of the inability to form very closely spaced polycrystalline silicon (polysilicon) conductor lines over the surface of a read only memory.

Researchers in the integrated circuit field generally have used the sidewall technology to form smaller spaces, than normally available through lithography for various purposes. Examples of this type of application is shown in U.S. Pat. No. 4,502,914 to H. J. Trumpp et al; U.S. Pat. No. 4,839,305 to J. K. Brighton and U.S. Pat. No. 4,868,136 to A. Ravaglia.

However, in the read only memory field the researchers have used two layer polysilicon structures to make more density packed memories such as described in Y. Naruke U.S. Pat. No. 5,002,896. While these have been successful, it is clear that if a single layer, closely spaced technology were available there are advantages over the two layer structures. One advantage for the single layer structure is in the planarity of the surface over a two layered structure. Other advantages are cost effectiveness and process simplicity.

SUMMARY OF THE INVENTION

A principal object of the invention is to provide an effective and very manufacturable method to fabricate a read only memory (ROM) or the like integrated circuit wherein the polysilicon conductive lines are very closely spaced, on the order of 0.1 to 0.3 micrometers apart.

In accordance with this invention, a new method of forming a closely spaced self-aligned polysilicon pattern of conductive lines is achieved. The method involves forming semiconductor device structures in and on a semiconductor substrate. An insulating layer is formed over the device structures. An insulating layer structure is formed over the semiconductor device structures. A conductive polysilicon layer is formed over the insulating layer. A silicon oxide layer is formed over the polysilicon layer. The oxide layer is now patterned by lithography and etching. The patterning of the oxide layer leaves a first pattern of the oxide over a first designated plurality of polysilicon conductor lines and a second pattern between the oxide which exposes the polysilicon layer over a second designated plurality of polysilicon conductor lines plus the planned spacing between the first and second plurality of polysilicon conductor lines. A uniform thickness silicon nitride layer is deposited over the oxide layer and the exposed polysilicon layer wherein the thickness is the width of the planned spacing. The nitride layer is anisotropically etched to produce sidewall structures having the width of the planned spacing. The exposed polysilicon layer is oxidized to form a silicon oxide layer thereon. The sidewall structures are removed by etching. The exposed polysilicon layer is anisotropically etched to form the closely spaced polysilicon conductor lines. The oxide layers over the polysilicon conductor lines are removed as by etching.

BRIEF DESCRIPTION OF THE DRAWINGS

In the accompanying drawings forming a material part of this description, there is shown:

FIG. 7 is a cross-sectional view taken along 7—7 of FIG. 8.

FIGS. 9A and 9B show the cross-section along 9—9 of FIG. 8 wherein FIG. 9A shows the cross-section where a ROM integrated circuit structure is present and wherein FIG. 9B shows the cross-section where an EPROM integrated circuit structure is present.

DESCRIPTION OF THE PREFERRED EMBODIMENTS

Figure 1:
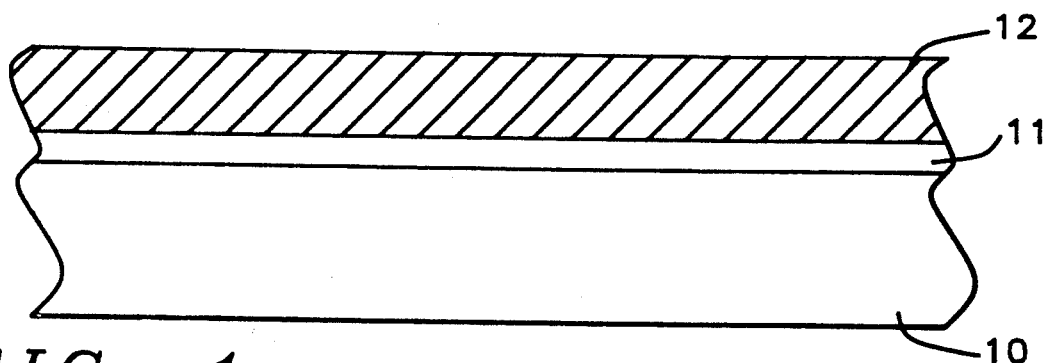
FIGS. 1 through 7 schematically illustrate in cross-sectional representation one preferred embodiment of forming closely spaced polysilicon conductor lines of this invention.
Figure 2:
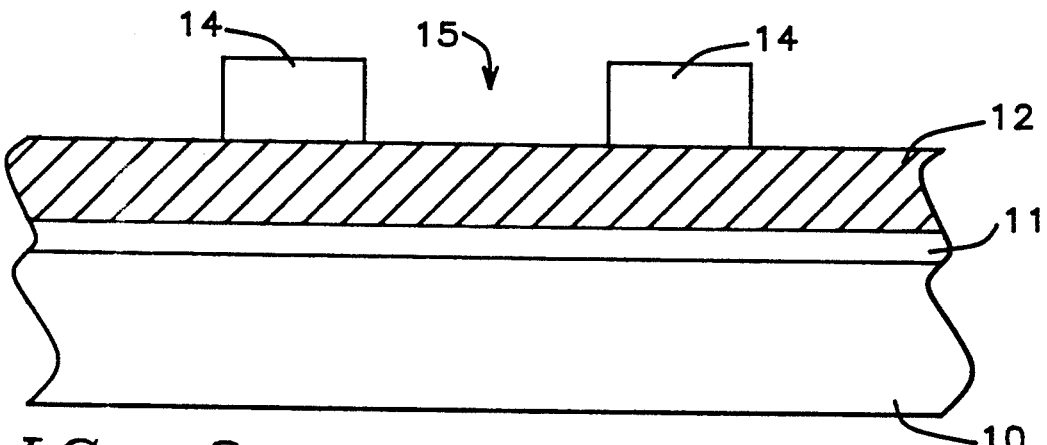

Referring now more particularly to FIG. 1, there is illustrated a partially completed ROM structure in which there is a monocrystalline silicon semiconductor substrate 10. In the substrate 10, there are diffused regions (not shown) which are typically N type source/-drain regions as are known in the art. The BN+ type regions and field silicon oxide regions, FOX within the substrate 10 are described with regard to FIGS. 9A, 9B and 9C. These regions are to be connected as bit lines or ground depending upon the particular need of the circuit. These structures are not specifically illustrated at this time, since they are in themselves known structures. They will be discussed further in FIGS. 8, 9A and 9B.

The insulating layer 11 is formed on top of the silicon substrate 11 with the ROM structure described above. The insulating layer 11 is preferably composed of silicon oxide and has thickness of between about 100 and 300 Angstroms.

A polysilicon layer 12 is formed by low pressure chemical vapor deposition (LPCVD) using silane at about 620° C. The preferred thickness of the polysilicon layer 12 is between about 2000 to 4000 Angstroms. The polysilicon layer 12 is doped with phosphorus oxychloride at about 900° C. Alternatively, the polysilicon layer can be doped in situ, that is during its deposition.

A layer of silicon dioxide is deposited over the polysilicon layer 12. This is done by Chemical Vapor Deposition to a thickness of between 2000 and 4000 Angstroms. Conventional lithography and oxide dry etch are now used to pattern the silicon oxide to the critical pattern necessary to give the desired narrowly spaced, single level polysilicon conductor pattern. The patterning of the oxide layer 14 leaves a first pattern of the oxide 14 over a first designated plurality of polysilicon conductor lines and a second pattern between the oxide which exposes the polysilicon layer at windows 15 over a second designated plurality of polysilicon conductor lines plus the planned spacing between the first and second plurality of polysilicon conductor lines.

Figure 3:
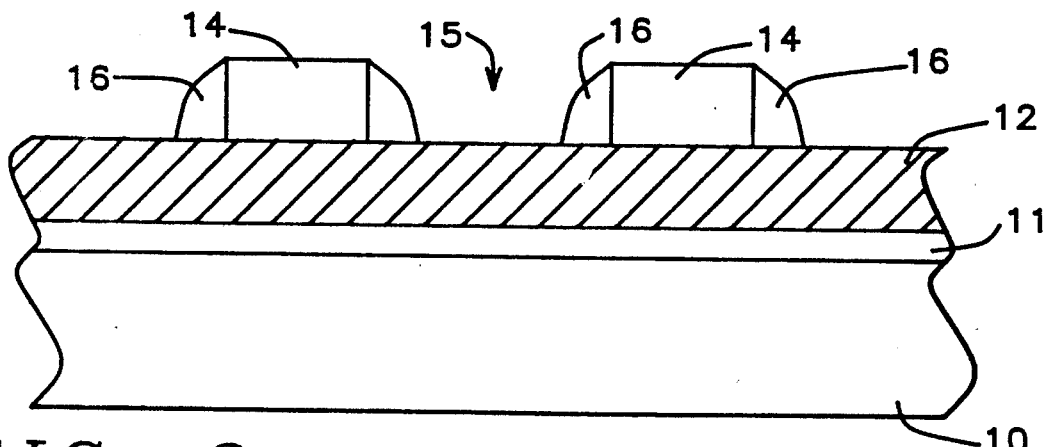

Referring now to FIG. 3, a uniform thickness silicon nitride layer 16 is deposited over the oxide layer and the exposed polysilicon layer wherein the thickness of the silicon nitride layer is the width of the planned spacing. The silicon nitride spacers 16 are now formed by anisotropically etching the silicon nitride layer 16 using conventional gases under the standard conditions. The thickness of the silicon nitride is critical to the process and is between about 1000 and 3000 Angstroms.

Figure 4:
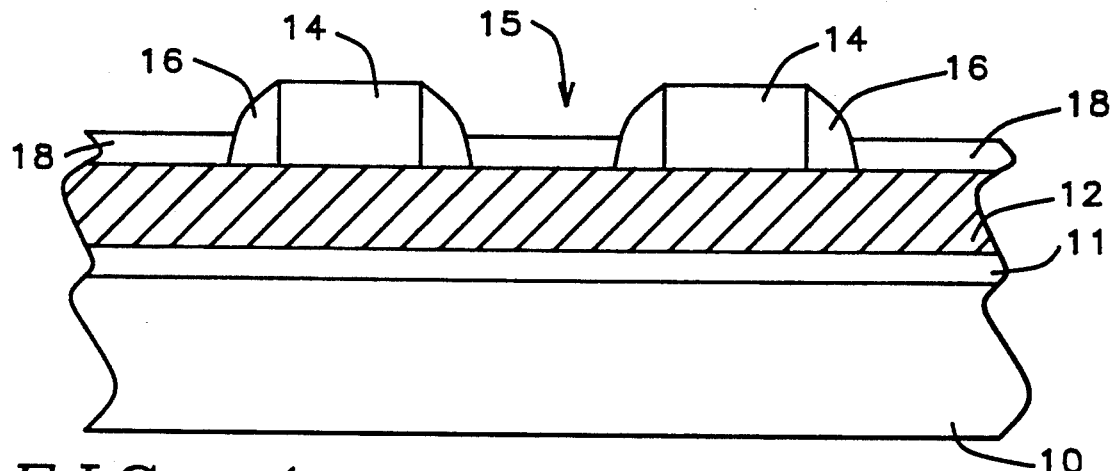

Referring now to FIG. 4, the exposed surfaces of polysilicon layer 12 is oxidized by conventional thermal oxidation in wet or dry oxygen at about 900° C. through windows 15 resulting in silicon dioxide layer 18. The thickness of the silicon oxide layer is between about 200 to 1000 Angstroms.

Figure 5:
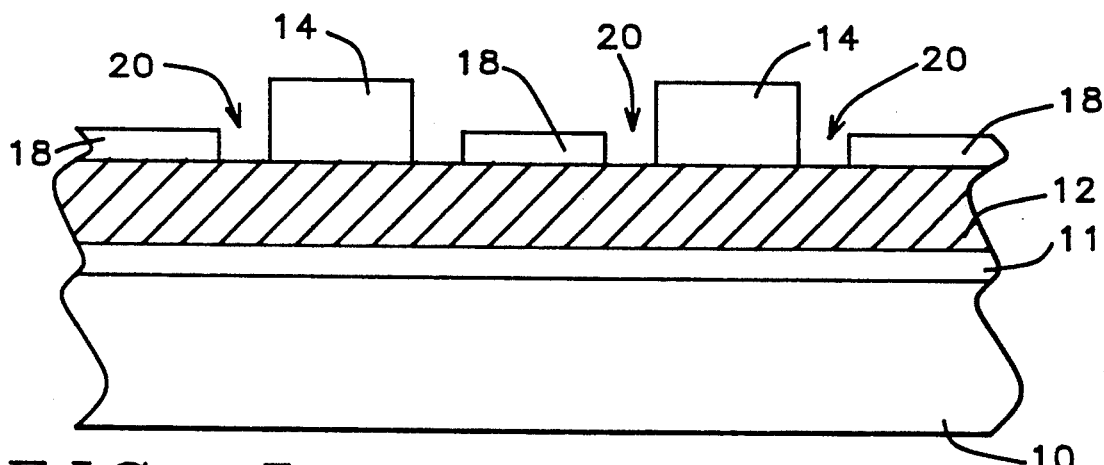

An etch, which may be preferably wet chemical etching is performed to remove the silicon nitride sidewall structures 16 leaving windows 20. This critical step involves first applying a dip etch of HF or an ammonia buffered HF to remove the thin silicon oxide (not shown) over the silicon nitride 16. Then hot phosphoric acid is used to selectively remove the silicon nitride spacers 16. Only the hot phosphoric acid gives the best possible selectivity vs. silicon oxide. This is a self-aligned step requiring no lithography step and results in a spacing of less than 0.8 micrometers for example for 0.8 micrometers technology. The spacing would be less than about 0.5 micrometers for 0.5 micrometer technology. The result of these processing steps is shown in FIG. 5.

Figure 6:
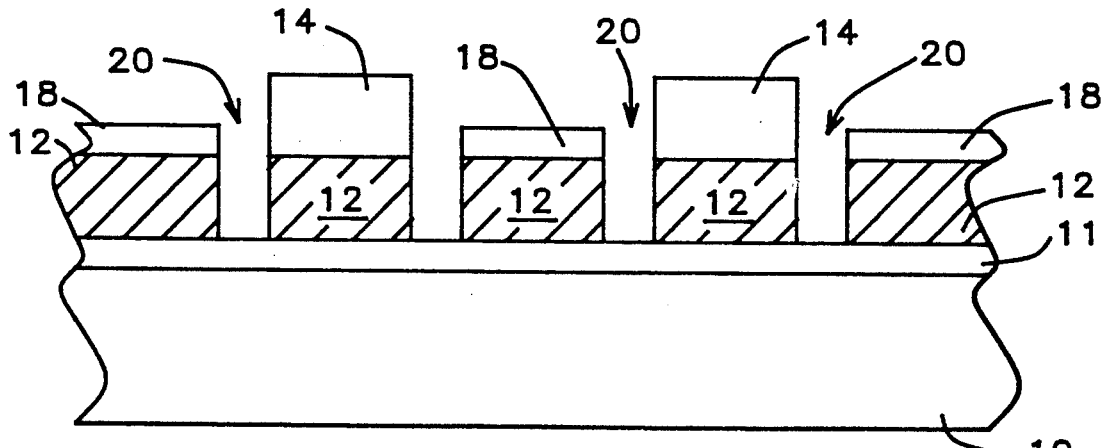
Figure 7:
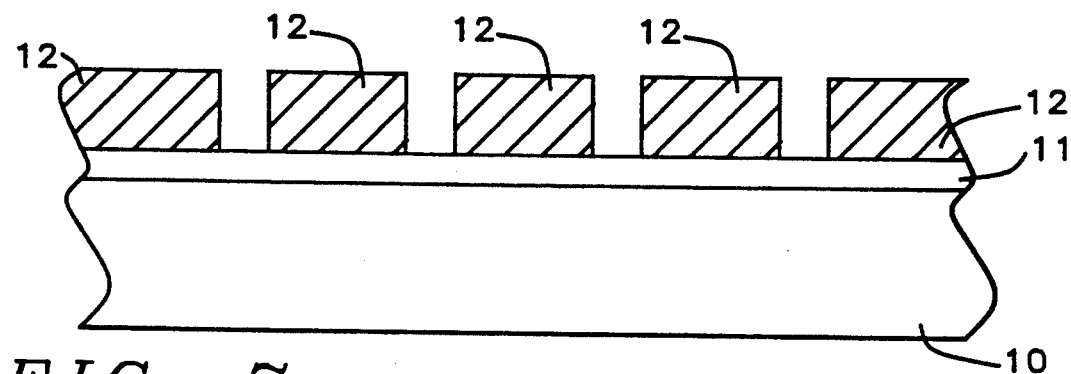

A standard anisotropic polysilicon etch is performed to extend the windows 20 to the insulating layer 11, as illustrated in FIG. 6. The removal of the silicon dioxide mask 14, 18 is accomplished by use of a hydrofluoric acid to complete the closely spaced conductive polysilicon line construction as shown in FIG. 7.

Figure 8:
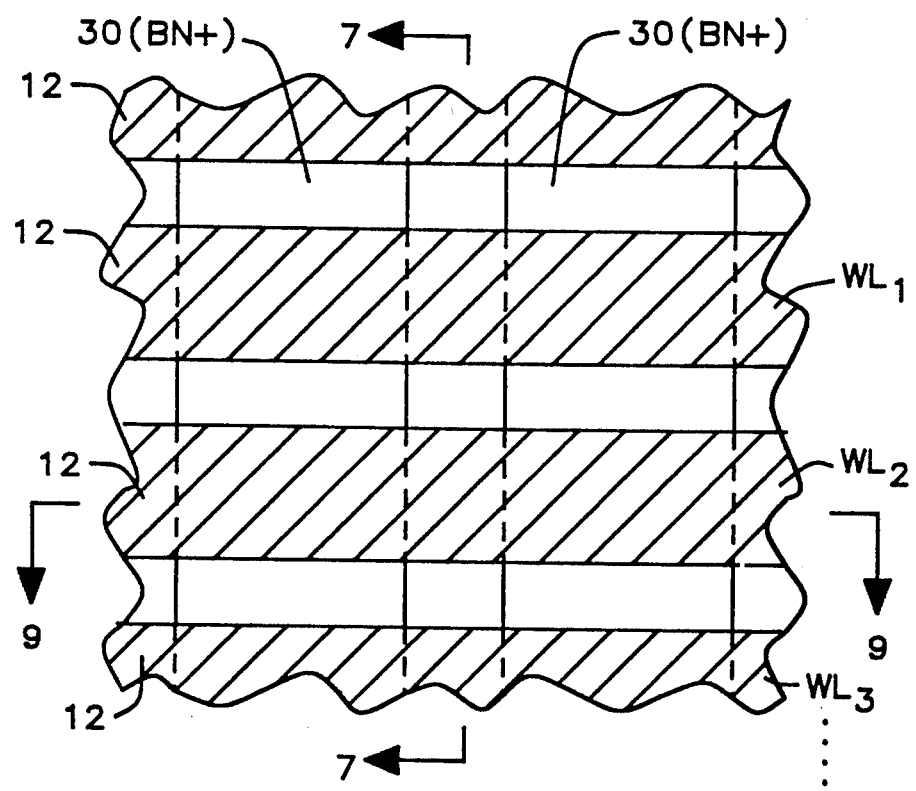
FIG. 8 is a schematic illustration of a top view of a portion of the integrated circuit of the invention.
Figure 9A:
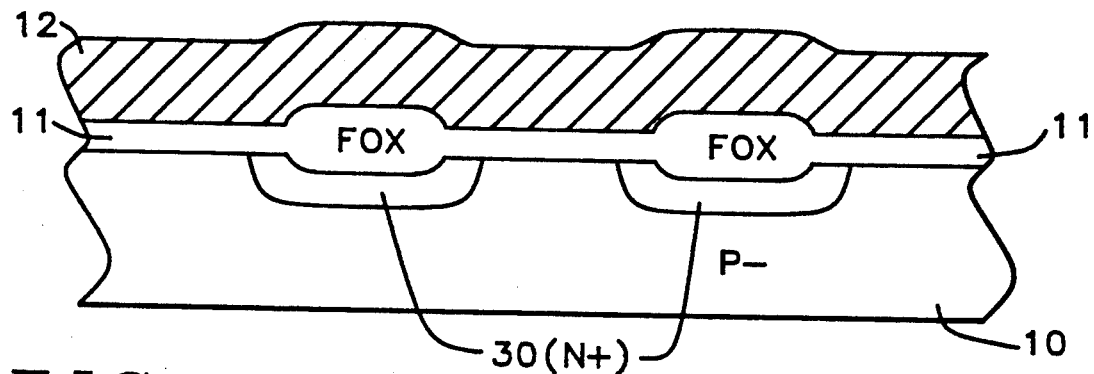
Figure 9B:
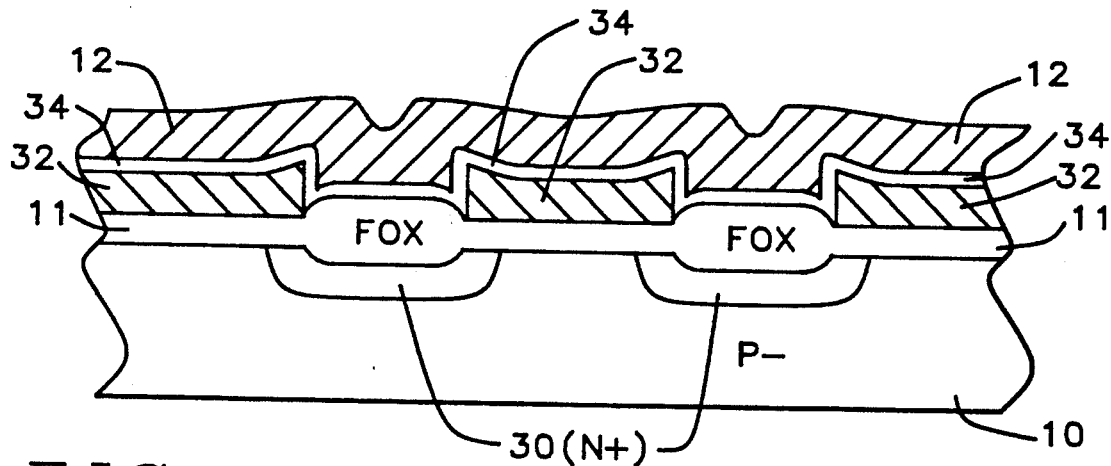

Referring now more particularly to FIG. 8, 9A and 9B, the single level, narrowly spaced polysilicon conductors 12 are shown in relationship to the buried bit lines, BN+. The buried bit lines, BN+ are N+ doped diffused or ion implanted regions 30 within the semiconductor substrate 10. These lines are formed by conventional techniques within the substrate 10 before the process for making the single level, narrowly spaced polysilicon lines 12. FIG. 8 is a top view of either a ROM or EPROM integrated circuit device and illustrates the planar view of the structure relationship to the word lines, $WL_1$, $WL_2$, $WL_3$, etc. to the buried N+ bit lines, BN+ or 30. The cross-section 7—7 of FIG. 8 is shown in FIG. 7. The cross-section of 9—9 is shown in FIG. 9A for a ROM integrated circuit wherein the line 12 is not connected, as seen in the drawing to the buried N+ regions BN+ or 30 as the BN+ regions as under field silicon oxide regions, FOX. The FIG. 9B shows a EPROM integrated circuit wherein lower electrode 32 is electrically isolated from the electrode 12 with insulator 34 as is known in the EPROM device technology. The line 12 is not connected to the buried N+ regions BN+ or 30 as the BN+ regions are under field silicon oxide regions, FOX.

The formation of the buried N+ regions 30 were formed, of course are done before the FIG. 1-7 process begins. The pattern of N+ regions are formed through the appropriate lithography masking procedures and ion implantation of N+ dopant, such as arsenic. The field silicon oxide, FOX pattern is then preferably formed by natural oxidation over the N+ regions to form the BN+ regions 30, in a wet oxidation process which forms silicon oxide layer 11. The desired oxide ratio is typically 5, that is where there is a gate oxide of 200 Angstroms, there is 1000 Angstroms of FOX silicon oxide formed on the N+ doped regions. Alternatively, it is possible to form the field silicon oxide, FOX by the recessed oxide or LOCOS technique.

The preferred process sequence for forming an EPROM type IC device of FIG. 9B begins with the formation of gate oxide layer 11 using a wet oxidation process. Polysilicon layer 12 is deposited and doped with N dopant. A lithography and etching process is done to remove the first polysilicon layer 32 over the planned BN+ regions. N+ arsenic dopant is ion implanted into the substrate in the desired pattern. Preferential oxidation with a wet oxygen atmosphere causes the formation of the desired FOX isolation over the N+ regions and the formation of buried BN+ regions 30. The oxidation resulting on the polysilicon layer 32 is much less than that on the N+ region, because the heavy N+ doping in the substrate enhances the oxidation formation much more than the much lower doping level in first polysilicon layer. A buffered HF etchant is used to remove silicon oxide from the first polysilicon layer. A composite silicon oxide, silicon nitride and silicon oxide layer (ONO) is preferably used as the interpoly dielectric 34. The second polysilicon layer 12 is deposited and the layer is formed into closely spaced polysilicon word lines, $WL_1$, $WL_2$, $WL_3$ . . . by the method disclosed above. Further anisotropic etching is used to etch the first polysilicon layer 32 and ONO dielectric layer 34 as self aligned to the second polysilicon lines 12 which forms to floating gate structures 32 seen in FIG. 9B.

The process then is continued as understood by those skilled in the art to form the required interconnection metallurgy and passivation to complete the integrated circuit of the invention.

Figure 9C:
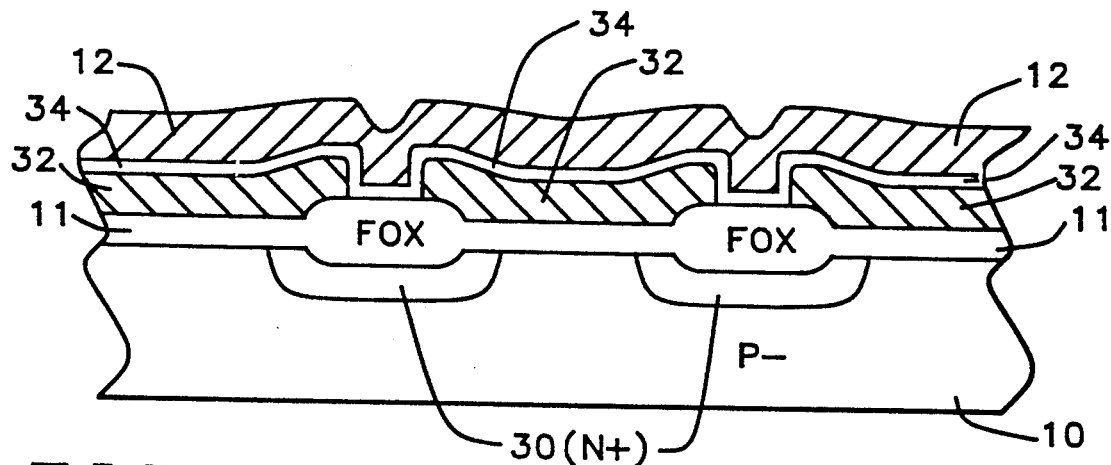
FIG. 9C shows the cross-sectional representation that is another embodiment of the invention which is a variation of the FIG. 9B structure.

Referring now to FIG. 9C., there is shown the structure of an EPROM which is a variation to that of FIG. 9B. The principal differences are that the first polysilicon layer 32 overlaps the BN+ regions, the first polysilicon etch is not self-aligned to the BN+ and the first polysilicon etch is done using the method of this invention. The process sequence is substantially the same otherwise to the FIG. 9B one given above. It proceeds by forming the gate oxide, BN+ and field silicon oxide over the BN+ using the same method as in the ROM process, first polysilicon deposition, dope first polysilicon, etch first polysilicon to form the closely spaced polysilicon lines (as described above in FIGS. 1-7 for the polysilicon lines 12), the ONO process for interpoly dielectric, second polysilicon layer 12 deposition, forming closely spaced polysilicon word lines 12 by the FIG. 1-7 method, further anisotropic etch of the first polysilicon layer 32 and ONO layer 34 self aligned to the second polysilicon pattern 12 and the floating gate is completed with appropriate insulating, metallurgy and passivation layers as is known in the art.

The advantages of the FIG. 9C embodiment includes (1) the increase of the ONO surface between the first polysilicon and second polysilicon layers, hence capacitance is enhanced (improved coupling) to improve device reliability, speed, etc. and (2) the increase of the capacitance is due to the overlap of the first polysilicon layer on the BN+ field oxide which extra area is not at the expense of a larger cell area.

The process of the invention results in closely spaced lines and word lines in ROM, EPROM, and Flash EPROM integrated circuits. Line spacing is less than about 0.8 micrometers for 0.8 micrometer feature size process and preferably between about 0.1 to 0.3 micrometers. The advantages of such a single level or layer polysilicon with very narrow line spacing allows the density to be double that of normal device in integrated circuits. For example, where a 32 Mbit ROM or EPROM integrated circuit could be designed using normal technology, this narrow line spacing would allow a 64 Mbit ROM or EPROM integrated circuit design. Further, the single level polysilicon line technology reduces the planarization problems of double polysilicon line technology.

While the invention has been particularly shown and described with reference to the preferred embodiments thereof, it will be understood by those skilled in the art that various changes in form and details may be made without departing from the spirit and scope of the invention. For example, refractory metal silicide, polycide and the like may be substituted for polysilicon lines.

What is claimed is:

1. The method of manufacturing single level polysilicon conductor lines in a EPROM integrated circuit comprising:
    forming buried regions of a conductivity type in an opposite conductivity type semiconductor substrate;
    forming an insulating layer structure over said semiconductor substrate;
    forming floating gate and gate dielectric layer structures on the surface of said semiconductor substrate;
    forming a conductive polysilicon layer over said gate dielectric layer which comprises a first and a second designated plurality of polysilicon conductive lines;
    forming a silicon oxide layer over said polysilicon layer and patterning said oxide layer;
    said oxide layer is patterned such that it covers the first designated plurality of polysilicon conductive lines and exposes the second designated plurality of polysilicon conductive lines and the portion of the polysilicon conductive layer which will be removed to provide planned spacing between the first and second designated pluralities of polysilicon conductive lines;
    depositing a uniform thickness silicon nitride layer over said oxide layer and said exposed polysilicon layer wherein said thickness is the width of said planned spacing;
    anisotropically etching said nitride layer to produce sidewall structures having the width of said planned spacing;
    oxidizing the exposed portion of said polysilicon layer;
    removing said sidewall structures by etching;
    anisotropically etching the resulting exposed said polysilicon layer to form said single level polysilicon conductor lines;
    removing the remaining portions of said oxide layer; and
    electrically connecting said polysilicon lines to form word lines and said floating gate structures and said buried regions as bit lines to form said EPROM integrated circuit.

2. The method of claim 1 wherein said polysilicon layer has a thickness of between about 2000 to 4000 Angstroms and is doped with phosphorus after deposition using phosphorus oxychloride.

3. The method of claim 1 wherein said silicon oxide layer is formed to a thickness of between about 2000 to 4000 Angstroms.

4. The method of claim 1 wherein said silicon nitride layer has a thickness of between about 1000 to 3000 Angstroms.

5. The method of claim 1 wherein said anisotropic etching ambient for etching said polysilicon layer is composed of chlorine/helium.

6. The method of claim 1 wherein said etching of said silicon nitride to form said sidewall layer is done using phosphoric acid.

* * * * *